United States Patent [19]

Inoue

[11] Patent Number: 5,049,251
[45] Date of Patent: Sep. 17, 1991

[54] SPUTTERING METHOD FOR FABRICATING THIN FILM

[75] Inventor: Minoru Inoue, Kawasaki, Japan

[73] Assignee: Fujitsu Limited, Kawasaki, Japan

[21] Appl. No.: 362,712

[22] Filed: Jun. 7, 1989

[30] Foreign Application Priority Data

Jun. 10, 1988 [JP] Japan .................. 63-141507

[51] Int. Cl.$^5$ .................. C23C 14/34; C23C 14/54
[52] U.S. Cl. .................. 204/192.12; 204/298; 204/298.04
[58] Field of Search .................. 204/192.12, 298 GF

[56] References Cited

U.S. PATENT DOCUMENTS

| 4,379,743 | 4/1983 | Nakatsukasa et al. | 204/298 GF |
| 4,428,812 | 1/1984 | Sproul | 204/192.15 |
| 4,440,618 | 4/1984 | Suzuki et al. | 204/298 |

FOREIGN PATENT DOCUMENTS

| 62-211377 | 9/1987 | Japan | 204/298 GF |
| 63-12938 | 3/1988 | Japan | 204/298 GF |
| 63-259076 | 10/1988 | Japan | 204/298 GF |

Primary Examiner—Aaron Weisstuch
Attorney, Agent, or Firm—Armstrong, Nikaido, Marmelstein, Kubovcik & Murray

[57] ABSTRACT

A method for sputtering by a glow discharge in gas is disclosed. The sputtering chamber is evacuated by a pump with a high speed, and the flow rate of the gas injected into the chamber is varied periodically between a high flow rate and a low flow rate. During the high flow rate, the discharge is ignited. The glow discharge is sustained during the low flow rate injection period, and when the pressure becomes too low to maintain a stable discharge, the flow rate is again increased to ignite or reinforce the electric discharge. In such a manner, the flow rate of the injection gas is periodically alternated between a high and a low injection rate. The sputtering is mostly done at the lower injection rates, and the evacuation speed is kept always high. Accordingly, contamination otherwise caused by residual gas is prevented, and a high grade sputtered film is obtained. By operating in this manner, the gas consumption is reduced and the life of the cryogenic pump, used for evacuating the sputtering chamber, is prolonged, and hence the on line operation of the sputtering device is improved.

7 Claims, 3 Drawing Sheets

SPUTTERING METHOD FOR FABRICATING THIN FILM

BACKGROUND OF THE INVENTION

1. Field of the Invention

The present invention relates to a method for fabricating thin films of various materials by electric glow discharge in gas. It especially relates to a sputtering method having a high sputtering efficiency at a low gas pressure which assures low contamination and a high grade of sputtered film, while keeping the consumption of gas low.

Sputtered thin films are used in variety of industries, such as production of semiconductor devices, thin film circuit boards, optical equipment, etc. There are several methods for forming thin films. Among them, electrical sputtering is one of the most widely used methods and it can be used for sputtering various materials, such as metals, dielectrics or semiconductor materials.

2. Description of the Related Art

Sputtering is a method whereby a material to be sputtered is bombarded with ions in a plasma formed by electric discharge, and the material is sputtered onto an object in the form of a film. Recently, in order to increase the sputtering efficiency, a magnetic field has been applied to focus the ions on the target formed by the material to be sputtered. Such method is called in the art, magnetron sputtering.

The quality of the sputtered film depends largely on the sputtering conditions. Further, modern applications require high stability and purity of the thin film so produced. For example, recently, the design of very large scale integrated (VLSI) semiconductor circuits, and devices using such, have become very delicate. Therefore, the quality of the wiring, made of an aluminum thin film, affects the reliability of the devices. If oxygen or humidity are included in the sputtered aluminum film, the wiring often looks white because of small unevenness formed on the aluminum surface. The electrical conductivity of such wiring is lower than designed, and can cause disconnection by migration of aluminum.

The sputtering equipment must be very carefully maintained. The sputtering chamber should be degassed by baking it in vacuum before it is used, and the inert gas should be purified. Still, some impurities stray into the plasma, and cause contamination of the sputtered film. This decreases the reliability of the device and the production yield. Such contamination may be due to minute leakage in the sputtering chamber itself and/or to residual gas which is very difficult to perfectly remove from the chamber by preliminary degassing. Sometimes, this residual gas is brought into the sputtering chamber together with the object itself. For example, if an aluminum film is formed over a phosphosilicate glass (PSG) substrate, humidity is easily adsorbed by PSG and thus brought into the sputtering chamber. The adsorbed humidity is released by the sputtering, and may poison the sputtered aluminum film.

In ordinary sputtering apparatus, an ion plasma is formed by glow discharge in argon gas at a pressure of about $10^{-3}$ Torr. There is a range of desirable pressure for keeping a stable plasma in the sputtering chamber. Too high or low pressure, than the desirable pressure, does not maintain a stable electric discharge, and thus cannot maintain a stable plasma. In order to maintain such stable plasma, the pressure of gas in the sputtering chamber is controlled by injecting inert gas, argon for example, into the chamber or controlling the pumping speed of the evacuation pump to balance the pumping speed or the evacuation pump with the injected gas flow to the desired pressure.

In order to avoid the undesirable effect of any residual gas, higher pumping speed is better. But if the pumping speed is very high, the flow rate of the injection gas must be high to keep the pressure in the sputtering chamber at the desired pressure for a stable plasma. This consumes a larger volume of inert gas, argon gas for example, and thus reduces the life of the cryogenic pump which is used to pump out such gas. So, the on line availability of the sputtering apparatus decreases, because the pump must be replaced very often. If the pumping speed is decreased to save the injection gas, the contamination gas, especially gas released in the sputtering chamber, cannot be fully rejected. In this case, the quality of the sputtered film also decreases. This is a dilemma for the sputtering apparatus. In practical cases, the pumping speed is kept low to save the inert gas and to extend the pump life. Therefore, the quality of the sputtered grown thin film often suffers from contamination, and the production yield of high quality film because unstable.

SUMMARY OF THE INVENTION

The object of the present invention, therefore, is to provide a sputtering method which produces a high quality thin film with a high o line availability of the sputtering apparatus.

Another object of the present invention is to provide a method which conserves the flow of inert gas, keeping a stable glow discharge in a sputtering chamber which is evacuated with a high speed pump.

The above objects can be attained by periodically varying the flow rate of the inert gas injected into the sputtering chamber, while the pumping speed of the evacuation pump is kept high, in order to quickly substantially remove any contamination gas which is released in or leaked into the chamber. First, a large quantity of the inert gas is injected into the sputtering chamber for a short time period, 0.1 second, for example. The pressure in the chamber becomes high, and the glow discharge is ignited. But, since the vacuum pumping speed is high, the pressure in the chamber quickly goes down. At this time, a small quantity of gas is continuously injected into the sputtering chamber at a flow rate less than the pumping speed. The gas discharge continues, though it becomes weak, and continues for a longer period, a few tenths of a second, for example. During this period the most effective sputtering is done, because the pumping speed is high and the contamination is sucked off quickly. Before the glow discharge is terminated, the inert gas is again injected into the chamber for a short period of time to enhance the glow discharge, and such cycle is repeated. In such a manner, the inert gas flow rate is varied periodically.

Several ways to vary the flow rate are proposed. One is to inject the inert gas at a high flow rate for a very short time interval (0.2 sec.), thus enhancing the discharge, and then continue to feed in the inert gas at a low flow rate. This extends the effective time period of the glow discharge for a few tenths of a second while keeping high pumping speed. Thus the discharge is accomplished under a high evacuation speed and the total gas consumption is very small.

Another method is to periodically vary the flow rate of the injection gas to make the pressure in the sputtering chamber very quickly build up for a short time, and then allow it to slowly go down keeping the effective discharge period as long as possible.

In such a manner, gas consumption is reduced, the life of the cryogenic pump is extended, and hence the on-line availability of the sputtering device is improved. Those and other advantages of the present invention will be described in more detail in the following description of the preferred embodiments.

BRIEF DESCRIPTION OF THE DRAWINGS

Same or like reference numerals or numbers designate similar or corresponding parts throughout the drawings.

DESCRIPTION OF PREFERRED EMBODIMENTS

The sputtering method of the present invention will now be described referring to some preferred embodiments. The present invention is applicable for sputtering various materials, such as metals, dielectrics, semiconductors and so on. Though this disclosure will focus on application for sputtering aluminum onto a semiconductor substrate, the invention can be applied to any other sputtering objectives using various materials, and the application field can be extended to many diverse industries, such as thin film circuits, optical devices and so on. The sputtering apparatus described in the following embodiment is a magnetron sputtering apparatus, which is currently widely used in industry. This invention may be applied to any other type of glow discharge sputtering apparatus as well.

Figure 1:
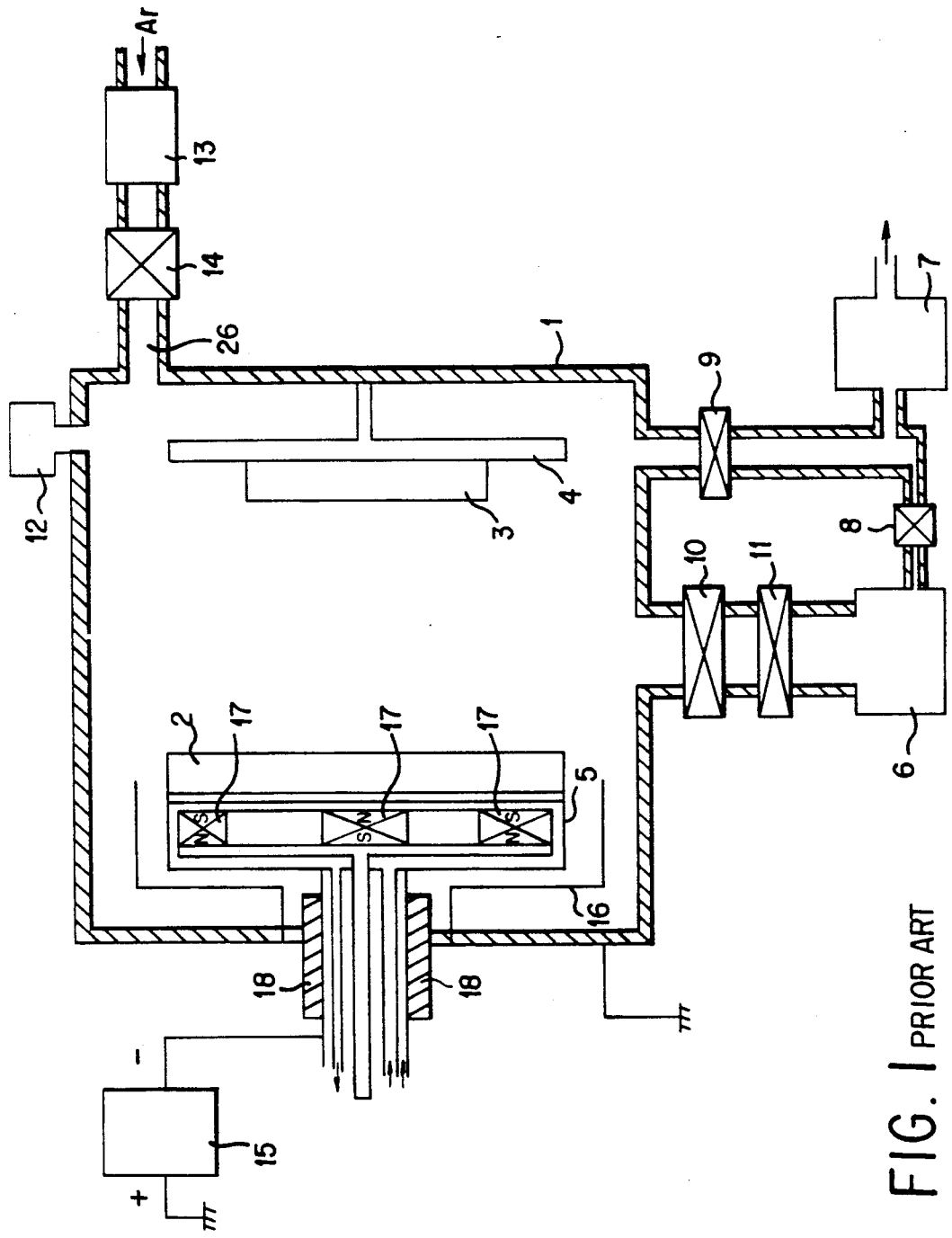
FIG. 1 schematically shows an exemplary configuration of a sputtering apparatus for use in this invention.

FIG. 1 shows schematically an exemplary sputtering apparatus applicable for various materials. In a sputtering chamber 1, a target 2 and an object 3, on which the sputtered thin film is to be grown, are placed facing to each other. The target is usually formed of a disk made of the material to be sputtered. The object 3 is held by an object holder 4, and the target 2 is supported by a target holder 5. The sputtering chamber 1 is evacuated by a cryogenic pump 6 and rotary pump 7. They are connected in cascade via a valve 8, but the rotary pump 7 can be also connected directly to the sputtering chamber 1 via another valve 9 for coarse evacuation. A gate valve 10 and a variable conductance valve 11, are provided between the cryogenic pump 6 and the sputtering chamber 1, which controls the pumping speed. The pressure in the sputtering chamber 1 is indicated on a manometer 12. An inert gas, argon for example, is fed through a mass flow controller 13 and an electromagnetic valve 14. The target holder 5 is water cooled with water whose inlet and outlet are respectively shown by small arrows. The negative side of a high voltage source 15 is electrically connected to the target holder 5 and thus to the target 2, while the positive side of the high voltage source 15 is grounded. On the back side of the target holder 5 is positioned a shield plate 16 which limits the glow discharge to the surface of the target 2, whereby preventing sputtering of the other parts of the target holder. For a magnetron sputtering apparatus, permanent magnets or electro-magnets 17 are provided on the back side of the target holder 6. The target holder 5 is electrically isolated from the sputtering chamber 1 by an insulator 18. These elements described above, except the target 2 and the object 3, are all standard equipments associated with conventional sputtering equipment. So, further description of these elements is omitted for the sake of simplicity.

Generally, the higher the pumping speed the better, in order to remove impurity or residual gas and to attain high quality of sputtered material. So, a high speed pump is used in ordinary sputtering apparatus, and an inert gas is injected into the sputtering chamber. In order to maintain a stable glow discharge, the pressure in the sputtering chamber should be in a proper range. Therefore, if the pump is operated at full speed, the pressure in the sputtering chamber may become too low to maintain the glow discharge. Under these conditions, the inert gas flow must be increased to balance with the evacuation pumping speed. This makes the consumption of gas become very large, and quickly reduces the effectiveness of the cryogenic pump. Therefore, the pump must be repeatedly refurbished or replaced and the on-line availability of the sputtering apparatus thus becomes low.

So, in an ordinary sputtering method, the pumping speed and the flow rate of the inert gas are controlled by adjusting the variable conductance valve 11 so as to balance the pumping speed with the inert gas flow. This means the pumping speed is slowed down, therefore, the sputtered material suffers from contamination by residual or adsorbed gas released in the sputtering chamber. This is especially undesirable for fabricating devices having very fine structures, such as LSI devices, etc. The device life is decreased by the contamination, and the production yield of the device becomes unstable.

The present invention intends to solve such difficulty. The inventor noticed that when the injection of the inert gas is pinched off after the discharge begins, the glow discharge is also quenched quickly. But if a small quantity of gas is injected continuously into the sputtering chamber, the glow discharge is sustained for a longer time period eve though the discharge current becomes small. But if the power source is operated in a constant power mode, the electric power supplied for the glow discharge from the power source does not decrease so rapidly, because though the discharge current decreases, the voltage goes up to maintain the discharge. Therefore, sputtering can be carried on effectively for a larger period of time during the time the glow discharge is continuing. Throughout this period, the pump is working at high speed, so the residual gases are removed quickly, and contamination of the sputtered product is suppressed. On the other hand, the total gas consumption is very small, because, during most of the time, the input inert gas flow is maintained at a low level.

Generally, there are two pressure ranges P1 and P2 in electric gas discharge. Under the first pressure range P1, which is usually about 2-15 mm Torr for example, the gas discharge occurs at a relatively low voltage, a few hundred volts for example. Under a pressure which is lower than the first pressure range P1, the discharge does not occur unless a very high voltage is applied; sometimes this voltage is high enough to cause a breakdown. In the second pressure range P2, which is immediately below the first pressure range, the electric discharge cannot occur at the same low voltage as in the first pressure range P1, but a discharge which has been ignited in the first pressure range P1, and then the pressure is decreased to P2 can be sustained in this lower pressure range. However, when the pressure goes further down, below the second pressure range P2, the glow discharge cannot be sustained.

Figure 2:
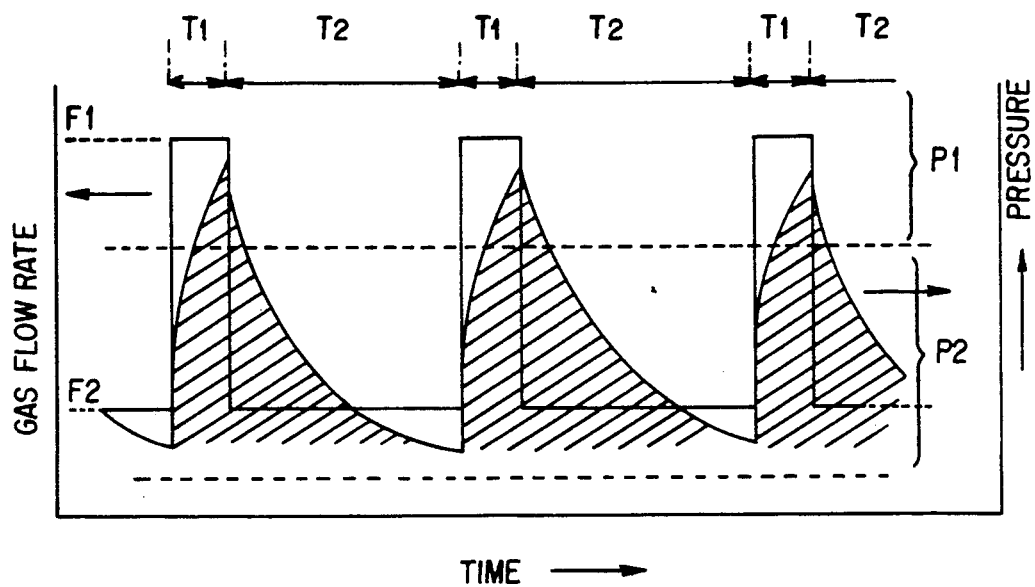
FIG. 2 is a time chart illustrating a flow rate of injection gas and variation of gas pressure in the sputtering chamber for a first embodiment of the present invention.

Utilizing such phenomena, the present invention proposes control of the injection gas flow, and variation of the pressure in the sputtering chamber. FIG. 2 illustrates schematically a time chart for an inert gas flow injected into the sputtering chamber, and the variation of pressure in the sputtering chamber over time. In FIG. 2, the abscissa shows time, the left hand side ordinate indicates the flow rate of the gas injected into the sputtering chamber, and the right hand side ordinate indicates the pressure in the sputtering chamber. The pressure changes in P1 and P2 depend on the kind of injected gas, the applied magnetic field, the shape of the target and object, and the applied voltage.

According to a first embodiment, the flow rate is kept to a high level F1 during a first time period T1. The high level flow rate F1 will be called the first flow rate hereinafter. By the injection of inert gas, the pressure in the sputtering chamber is raised to the first pressure range P1, and a glow discharge is ignited. As soon as the glow discharge occurs, or is enhanced, the inert gas flow rate is decreased to a lower flow rate F2, and the pressure begins to go down. The lower flow rate F2 is called the second flow rate hereinafter. But once glow discharge has been ignited, this discharge can be sustained at a pressure lower than the first pressure range P1. It should be noticed that, even though it is sustained, the discharge will soon become extinguished if the gas flow is truly stopped. But, if a small amount of the gas is continuously injected, as shown in FIG. 2, the glow discharge can be sustained for a longer time period. Since the second flow rate F2 is set to be lower than the evacuation pumping speed, the pressure will go down further. And if the pressure falls below the second pressure range P2, the discharge will be totally extinguished and require higher pressure restarting. Before that, namely before the gas pressure has decreased to below the second pressure range P2, inert gas is once again injected at a first flow rate F1, as shown in FIG. 2, and the glow discharge is enhanced again. The period during which the gas is injected with the low flow rate (F2) and the glow discharge is sustained will be called second time period T2 hereinafter.

The problem is how to prolong the second time period T2, during which the glow discharge is sustained under the second flow rate F2 of the gas injection, and how to decrease the first time period T1, during which the gas is injected at the first flow rate F1, to start or enhance the glow discharge. The condition greatly depends on the size of the sputtering chamber, evacuation speed, kind of gas, shape of the target and object, magnetic field for the magnetron sputtering operation, distance between the target and the object, etc.

But it is rather easy to empirically find out the proper conditions on a case-by-case basis. The chamber, pumping speed, gas, target, and object are all determined to a specific value for each case by choosing the apparatus or design of the device. The first flow rate F1 will be obtained easily by gradually increasing the flow rate, thus determining the starting point of the glow discharge. The first time period T1, is preferably as short as possible consistent with truly starting the glow discharge. Therefore, it is not difficult to experimentally determine these conditions.

The remaining condition for the second flow rate F2 and the second time period T2 can be also easily determined. The supplied power from the high voltage source is considered to be the power consumed by the glow discharge, and is used for bombarding the target to sputter it. If a constant DC power output supply source is used, the voltage between the target and the object automatically increases when the pressure in the discharge chamber is decreased, and the glow discharge is maintained. So, the output power is kept almost constant during the second period T2. But when the pressure becomes too low, the power supply source cannot supply enough voltage, and the discharge current decreases quickly. This signals the end of the second time period T2. Too low a power consumption is useless because the sputtering rate becomes to small even though the plasma may still be sustained. Therefore, the glow discharge should be reinforced by injecting additional gas before it becomes too weak. T2 is measured by varying the second flow rate F2, and the optimum flow rate for lengthening T2 is thus determined. These conditions are not that critical. Even if the plasma is extinguished, it does no harm since it can be reignited by increasing the pressure.

It should be noted that the second flow rate F2 should be far below the pumping speed. Since, if F2 becomes too large, F2 might balance with the pumping speed, and T2 may become very long. But this is not a solution, because the consumption of gas increases and the useful period of the pump becomes short. Practically, the second flow rate F2 may be less than a few tenths of the pumping speed. With such a small flow rate, sufficiently long time periods of T2 can be attained.

In like manner, the sputtering conditions are easily determined on a case-by-case basis. These conditions are also not too critical. One example will be given for sputtering aluminum onto a silicon substrate.

| | |
|---|---|
| Target: | aluminum disc including 1 weight % of silicon, 290 mm in diameter |
| Object: | silicon substrate, 125 mm in diameter |
| Distance between the target and the object: | about 55 mm |
| Input Power: | 10 kW DC. |
| T1: | 0.2–05. sec |
| T2: | 10–30 sec |
| F1: | 80–100 sccm |
| F2: | 20–50 sccm |
| P1: | 2–5 mTorr |
| P2: | 0.5–2 mTorr |
| Pump Speed: | 1,200 liter./min for argon. |

The unit sccm means a standard cubic centimeter per minute, that is a flow rate (cc/min) measured at one atmosphere pressure at room temperature (20° C.).

Under such conditions, argon gas was used as the injection gas, and by sputtering for 40–50 sec, an aluminum film of about 1 μm thick was obtained. During the sputtering operation, the output of the DC power source varied from 400 V×25 A at the discharge starting time, to 800 V×12.5 A at the end of the second period T2. Ordinarily, constant DC power output supply sources vary their output voltage and current depending upon the load resistance in like manner.

As can be seen in the above example, the first period T1 is very short compared to the second period T2. So, most of the sputtering is done under the low injection flow rate, and the pump is always operated fully. Accordingly, the contamination caused by residual gas is generally greatly avoided.

Figure 3:
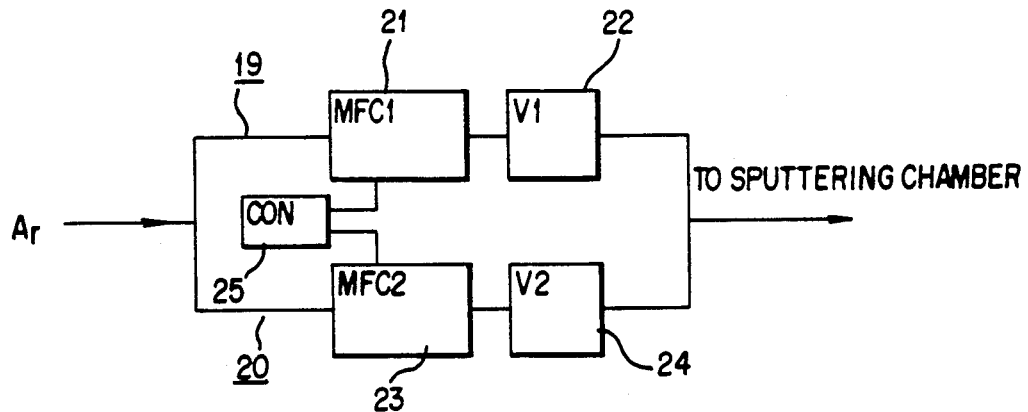
FIG. 3 shows a gas flow line system to achieve a desirable gas flow for the present invention.

FIG. 3 schematically illustrates a gas flow line system used to achieve a flow of injection gas as shown in FIG. 2. This system is composed of two piping systems connected in parallel. One is a high flow rate line 19 and the other is a low flow rate line 20. The high flow rate line 19 comprises a first mass flow controller (MFC1) 21 and a first electromagnetic valve (V1) 22, while the low flow rate line 20 comprises a second mass flow controller (MFC2) 23 and a second electromagnetic valve (V2) 24. V1 and V2 are controlled by a controller (CON) 25. By these mass flow controllers 21, 23, the gas flow rate through the high flow rate line 19 is adjusted to F1, the flow rate through the low flow rate line 20 is adjusted to F2.

Such a gas flow line system is connected to the gas inlet 26 of the sputtering chamber shown in FIG. 1, replacing the electromagnetic valve 14 and the mass flow controller 13. It will be easily understood that the flow rate can be varied as shown in FIG. 2 by simply switching the electromagnetic valves V1 and V2 to open respectively alternatively based upon the timing T1 and T2. Such control and programming for the controller 25 is a simple one, so further description is omitted for the sake of simplicity.

Figure 4:
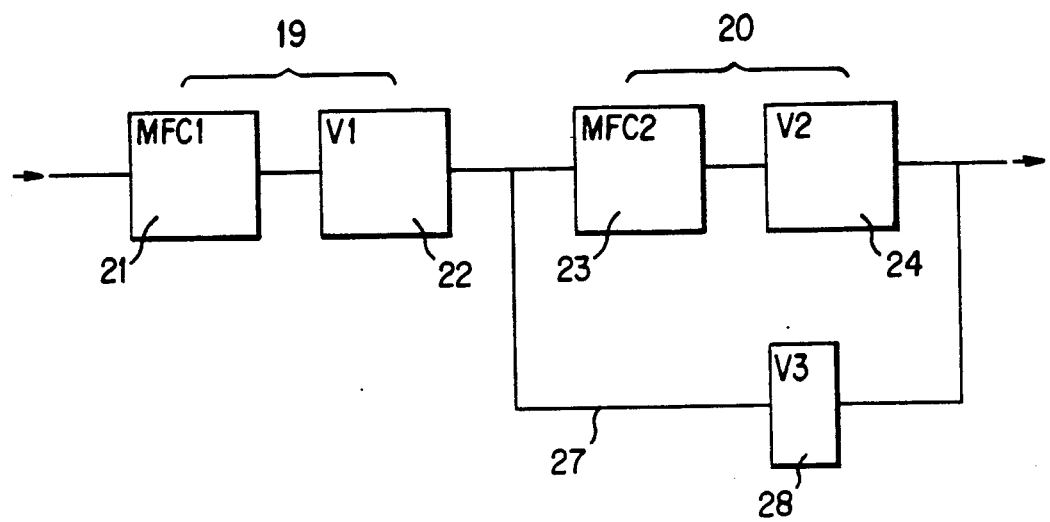
FIG. 4 shows another gas flow line system to achieve a desirable gas flow for the present invention.

FIG. 4 schematically illustrates another gas flow line system which is applicable to achieve the gas flow rate of FIG. 2. In this system, the high flow rate line 19 and the low flow rate line 20 are connected in series with each other. These lines respectively comprise the mass flow controllers MFC1 or MFC2, and the electromagnetic valves V1 or V2. The flow rates through these lines 19 and 20 are adjusted to be F1 and F2, respectively. The low flow rate line 20 is provided with a bypass line 27, which comprises a third electromagnetic valve (V3) 28. The electromagnetic valves V1, V2 and V3 are controlled by a controller (not shown). Such gas flow line system is connected to the gas inlet 26 of the sputtering chamber shown in FIG. 1. It will be understood that, when V1, V2 and V3 are opened, the injection gas flow rate becomes F1. If V3 is closed, and V1 and V2 are opened, the flow rate becomes F2. So, by controlling these valves, it is easy to achieve the gas flow of FIG. 2.

It will be understood that the flow rate of the injection gas need not necessarily be in a pulse form as shown in FIG. 2 in order to perform the sputtering of the present invention. The spirit of the present invention is to perform the sputtering under a proper variation of the pressure in the sputtering chamber. If the pressure in the sputtering chamber is varied like a manner as shown in FIG. 2, similar effects as described before will be attained.

Figure 5:
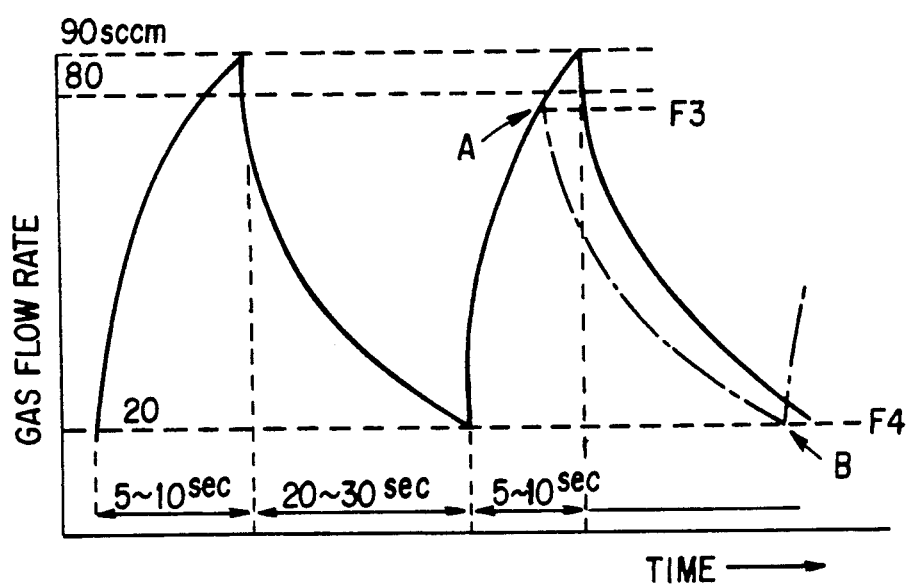
FIG. 5 is a time chart illustrating a flow rate of gas injected into the sputtering chamber for a second embodiment of the present invention.

FIG. 5 shows a flow rate of injection gas for a second embodiment of the present invention. In the figure, the ordinate is the flow rate, and the abscissa is time. As can be seen in FIG. 5, the flow rate of the injection gas is varied rather gradually compared to the variation of the flow rate shown in FIG. 2. The gas flow is increased gradually, so the pressure in the sputtering chamber also increases, and when the glow discharge is started or enhanced, the gas flow is decreased. So, the pressure in the sputtering chamber becomes low because the gas injection rate has become lower than the pumping speed. In like manner, the glow discharge is carried on mainly at a lower gas flow range.

Similarly to the first embodiment, the higher flow rate of the injection gas, by which the pressure in the sputtering chamber becomes the first pressure range P1, is called the first flow rate F1, and the flow rate by which the pressure in the sputtering chamber decreases to the second pressure range P2 is called the second flow rate F2. A slight difference should be noted from the first embodiment. In the first embodiment, the values of F1 and F2 were respectively constant, while in the second embodiment the category of F1 is expanded to cover a range of the flow rates by which the pressure in the sputtering chamber increases to the first pressure range P1. Similarly, the magnitude of F2 is also expanded to the flow rate by which the pressure in the sputtering chamber decreases to the second pressure range P2.

The variation of the flow rate in such a manner is obtained rather easily by controlling the electromagnetic valve 14 shown in FIG. 1. For such purpose, a piezo gas flow valve, for example, is applicable for use as the electromagnetic valve 14. It varies the impedance for the gas flow as a function of applied voltage.

The conditions needed to control the valve depend on the size of the sputtering chamber, the pumping speed, the kind of gas, the applied voltage, etc. It will be understood, however, that these conditions may be easily determined in a similar manner to the first embodiment described above. The conditions are not critical, and various modifications are possible. For example, the increment and decrement of the flow rate curve of FIG. 5 may be changed in various ways.

In an example of FIG. 5, the flow rate is increased from 20 sccm to 90 sccm in 5-10 seconds. The glow discharge is ignited at flow rates of about 80 sccm. This means that the pressure in the sputtering chamber reached the first pressure range P1 at this flow rate. At 90 sccm, the flow rate was decreased, and in 20-30 seconds, the flow rate was decreased to 20 sccm, then it was again increased. Such a variation of flow rate is repeated during the sputtering operation.

A modification of the second embodiment can be easily derived. In FIG. 5, when the glow discharge is ignited by the first increment of the flow rate (left hand side peak of the flow rate curve), in the following increments, the flow rate is not necessarily increased until the pressure in the sputtering chamber increases to the first pressure range P1, that corresponds to 80 sccm flow in FIG. 5. As shown by a chain line in FIG. 5, the flow rate may be decreased before the pressure reaches the first pressure range P1. The flow rate corresponding to the turning point A in FIG. 5 will be called the third flow rate F3 hereinafter. And when the flow rate is decreased to the lower turning point B in FIG. 5, about 20 sccm for the example, the flow rate is again turned to increase. The flow rate at the lower turning point B is called the fourth flow rate F4.

The third flow rate F3 corresponds to a flow rate at which the pressure in the sputtering chamber goes up to just below P1. The fourth flow rate F4 corresponds to a flow rate at which the pressure goes down to just above the bottom of the second pressure range P2. They must be determined case by case. The values of F3 and F4 are not so critical. It will be easy for one skilled in the art to determine these values in a manner similar to finding out the value of F2, as described with respect to the first embodiment.

In such manner, once the glow discharge is ignited, the injection gas flow is controlled to go up and down between F3 and F4. By doing so, the total gas consumption is further decreased compared to that of the second embodiment, and hence, the on stream period for the evacuation pump is further prolonged.

As has been described above, by the sputtering method of the present invention, the evacuation pump for the sputtering chamber is operated at full speed during the sputtering process. So, the residual gas in the chamber is removed quickly, and the contamination caused by such residual gas is avoided or at least substantially reduced. Therefore, a fine and high grade sputtered film can be produced. While the flow rate of the injection gas is reduced, the consumption of the gas is saved, and the on line period of the cryogenic pump can be prolonged, thus the working availability of the sputtering apparatus is improved.

The present invention has additional advantages in that the sputtering voltage is on the average increased, so that the sputtering rate is increased compared to prior art sputtering methods. Further, the sputtered film has good coverage of an object having indents on its surface. This is believed to be due to the fact that the sputtering is performed under a lower gas pressure, thus the mean free passage of the sputtered particle is increased. This enables the sputtered particles to travel along the electric lines of force which are perpendicular to the surface of the object.

In the above disclosure, the description has referred to a method for forming a thin film, especially an aluminum film, over a semiconductor substrate. The present invention is not restricted to such an application. It can be applied for fabricating various objects such as semiconductor devices, thin film circuits or devices, optical equipment and so on. The sputtered material can be varied, such as metals, dielectrics, semiconductors and so on.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all modifications which come within the meaning and range of equivalences of the claims, are therefore, to be embraced therein.

What is claimed is:

1. A method for sputtering a material on an object by a glow discharge generated in a sputtering chamber, said method comprising the steps of:
    a) placing an object in a sputtering chamber having a target made of material to be sputtered on said object therein, and evacuating the sputtering chamber;
    b) injecting a gas into said sputtering chamber, and increasing the pressure in said sputtering chamber to a first pressure sufficient to ignite said glow discharge;
    c) decreasing the flow rate of said injection gas, and thus decreasing the pressure in said sputtering chamber to a second pressure such that said glow discharge cannot be ignited but can be maintained for a limited time if the glow discharge has previously been ignited;
    d) before said glow discharge extinguishes, increasing the flow rate of said injection gas, and thus increasing the pressure in the sputtering chamber to said first pressure to at least reinforce the glow discharge; and
    e) repeatedly varying the flow rate of the injection gas, and varying the pressure in the sputtering chamber as aforesaid to maintain said glow discharge and sputtering therein.

2. A method for sputtering material as set forth in claim 1, wherein:
    in said step b), injecting the gas at a first constant flow rate F1 for a first time period T1 during which the pressure in said sputtering chamber increases to said first pressure and igniting or enhancing said glow discharge;
    in said step c), decreasing the gas flow rate to a second constant flow rate F2 for a second time period T2, which is longer than said first time period T1, during which the pressure in said sputtering chamber decreases to said second pressure;
    in said step d), increasing the gas flow rate to said first constant flow rate F1 for said first time period T1, during which the pressure in said sputtering chamber increases to said first pressure range P1 thereby reinforcing said flow discharge; and
    in said step e), repeating said steps c) and d) during the sputtering process.

3. A method for sputtering material as set forth in claim 2, wherein said second pressure is such that the glow discharge is on the verge of being distinguished.

4. A method for sputtering material as set forth in claim 2, wherein said second flow rate F2 is less than one tenth of the evacuation speed for evacuating said sputtering chamber, and said second time period T2 is more than ten times as long as said first time period T1.

5. A method for sputtering material according to claim 1, wherein:
    in said step b), injecting said injection gas into said sputtering chamber at a gradually increasing flow rate, and when the electric discharge is ignited, switching to step c);
    in said step c), gradually decreasing said flow rate of injection gas thereby decreasing the pressure in said sputtering chamber to a second pressure range P2, and when the gas pressure in the sputtering chamber is decreased to a predetermined second pressure, switching to step d);
    in said step d), gradually increasing the flow rate of the injection gas thereby increasing the pressure in the sputtering chamber to a predetermined first pressure, and when the glow discharge is reinforced, switching to step e); and
    in said step e), repeating said steps c) and d) during the sputtering process.

6. A method for sputtering material according to claim 5, wherein said second pressure is such that said glow discharge is on the verge of being distinguished.

7. A method for sputtering material according to claim 5, wherein the time duration for said step c) is shorter than the time duration for said step d).

* * * * *